United States Patent
Wei

(10) Patent No.: US 7,921,387 B2
(45) Date of Patent: Apr. 5, 2011

(54) COMPUTATIONAL EFFICIENCY IN PHOTOLITHOGRAPHIC PROCESS SIMULATION

(75) Inventor: Haiqing Wei, Jan Jose, CA (US)

(73) Assignee: Olambda, Inc, Los Altos, CA (US)

( * ) Notice: Subject to any disclaimer, the term of this patent is extended or adjusted under 35 U.S.C. 154(b) by 0 days.

(21) Appl. No.: 12/834,502

(22) Filed: Jul. 12, 2010

(65) Prior Publication Data
US 2010/0275178 A1  Oct. 28, 2010

Related U.S. Application Data

(63) Continuation of application No. 12/340,319, filed on Dec. 19, 2008, now Pat. No. 7,788,628, which is a continuation of application No. 11/708,444, filed on Feb. 20, 2007, now abandoned, which is a continuation-in-part of application No. 11/705,808, filed on Feb. 12, 2007, which is a continuation of application No. 11/331,223, filed on Jan. 11, 2006, now abandoned.

(60) Provisional application No. 60/774,329, filed on Feb. 17, 2006, provisional application No. 60/775,385, filed on Feb. 21, 2006.

(51) Int. Cl.
*G06F 17/50* (2006.01)
(52) U.S. Cl. ................ 716/56; 716/54; 716/55
(58) Field of Classification Search .............. 716/54, 716/55, 56
See application file for complete search history.

(56) References Cited

U.S. PATENT DOCUMENTS

| | | | |
|---|---|---|---|
| 6,728,937 | B2 | 4/2004 | Wakita et al. |
| 7,266,800 | B2 | 9/2007 | Sezginer |
| 2004/0133871 | A1 | 7/2004 | Granik et al. |
| 2005/0015233 | A1 | 1/2005 | Gordon |
| 2005/0114822 | A1 | 5/2005 | Axelrad et al. |
| 2005/0185159 | A1 | 8/2005 | Rosenbluth et al. |
| 2005/0204322 | A1 | 9/2005 | Kotani et al. |
| 2005/0216877 | A1 | 9/2005 | Pack et al. |

(Continued)

OTHER PUBLICATIONS

Schetzen, Martin. "Nonlinear System Modeling Based on the Wiener Theory", *Proceedings of the IEEE*, vol. 69, No. 12, Dec. 1981.

(Continued)

*Primary Examiner* — Thuan Do
*Assistant Examiner* — Magid Y Dimyan
(74) *Attorney, Agent, or Firm* — Cooper & Dunham, LLP

(57) ABSTRACT

Photolithographic process simulation is described in which fast computation of resultant intensity for a large number of process variations and/or target depths $(var, z_t)$ is achieved by computation of a set of partial intensity functions independent of $(var, z_t)$ using a mask transmittance function, a plurality of illumination system modes, and a plurality of preselected basis spatial functions independent of $(var, z_t)$. Subsequently, for each of many different $(var, z_t)$ combinations, expansion coefficients are computed for which the preselected basis spatial functions, when weighted by those expansion coefficients, characterize a point response of a projection-processing system determined for that $(var, z_t)$ combination. The resultant intensity for that $(var, z_t)$ combination is then computed as a sum of the partial intensity functions weighted according to corresponding products of those expansion coefficients. Prediction of a mask transmittance function as a function of illumination incidence angle for a regional cluster of source emitters is also described.

6 Claims, 8 Drawing Sheets

U.S. PATENT DOCUMENTS

| | | | |
|---|---|---|---|
| 2005/0229125 | A1 | 10/2005 | Tabery et al. |
| 2006/0034505 | A1 | 2/2006 | Luk-Pat et al. |
| 2006/0269875 | A1 | 11/2006 | Granik |
| 2007/0198963 | A1 | 8/2007 | Granik et al. |
| 2008/0059128 | A1 | 3/2008 | Tejnil |
| 2008/0134131 | A1 | 6/2008 | Asano et al. |
| 2009/0013303 | A1* | 1/2009 | Hwang et al. .................. 716/19 |

OTHER PUBLICATIONS

Cobb, Nicolas Bailey. "Fast Optical and Process Proximity Correction Algorithms for Integrated Circuit Manufactoring," Ph.D. Dissertation, University of California at Berkeley, 1998.

Shi, Xuelong, et al. "Eigen Decomposition Based Models for Model OPC," Proceedings of SPIE vol. 5446, pp. 462-470, 2004.

Martin, Patrick et al. "Exploring new high speed, mask aware RET verification flows," Proceedings of SPIE vol. 5853, pp. 114-123, 2005.

Pati, Y.C., et al. "Exploiting Structure in Fast Aerial Image Computation for Integrated Circuit Patterns," *IEEE Transactions on Semiconductor Manufactoring*, vol. 10, No. 1, pp. 62-74, Feb. 2007.

U.S. Appl. No. 12/340,319 filed Dec. 19, 2008.
U.S. Appl. No. 11/708,444 filed Feb. 20, 2007.
U.S. Appl. No. 11/708,299 filed Feb. 20, 2007.
U.S. Appl. No. 11/705,808 filed Feb. 12, 2007.
U.S. Appl. No. 11/331,223 filed Jan. 11, 2006.

* cited by examiner

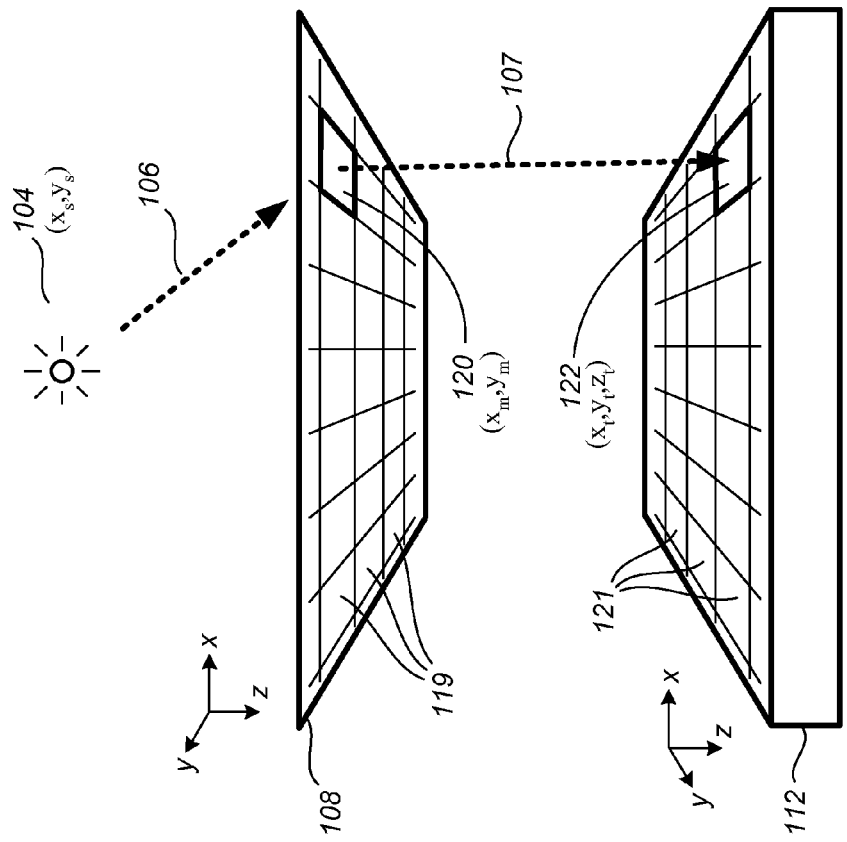
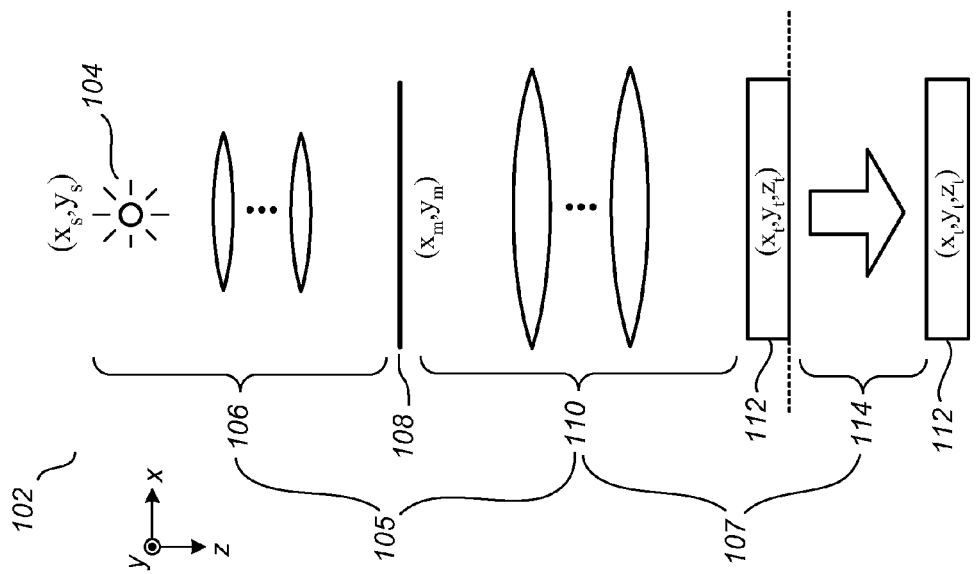

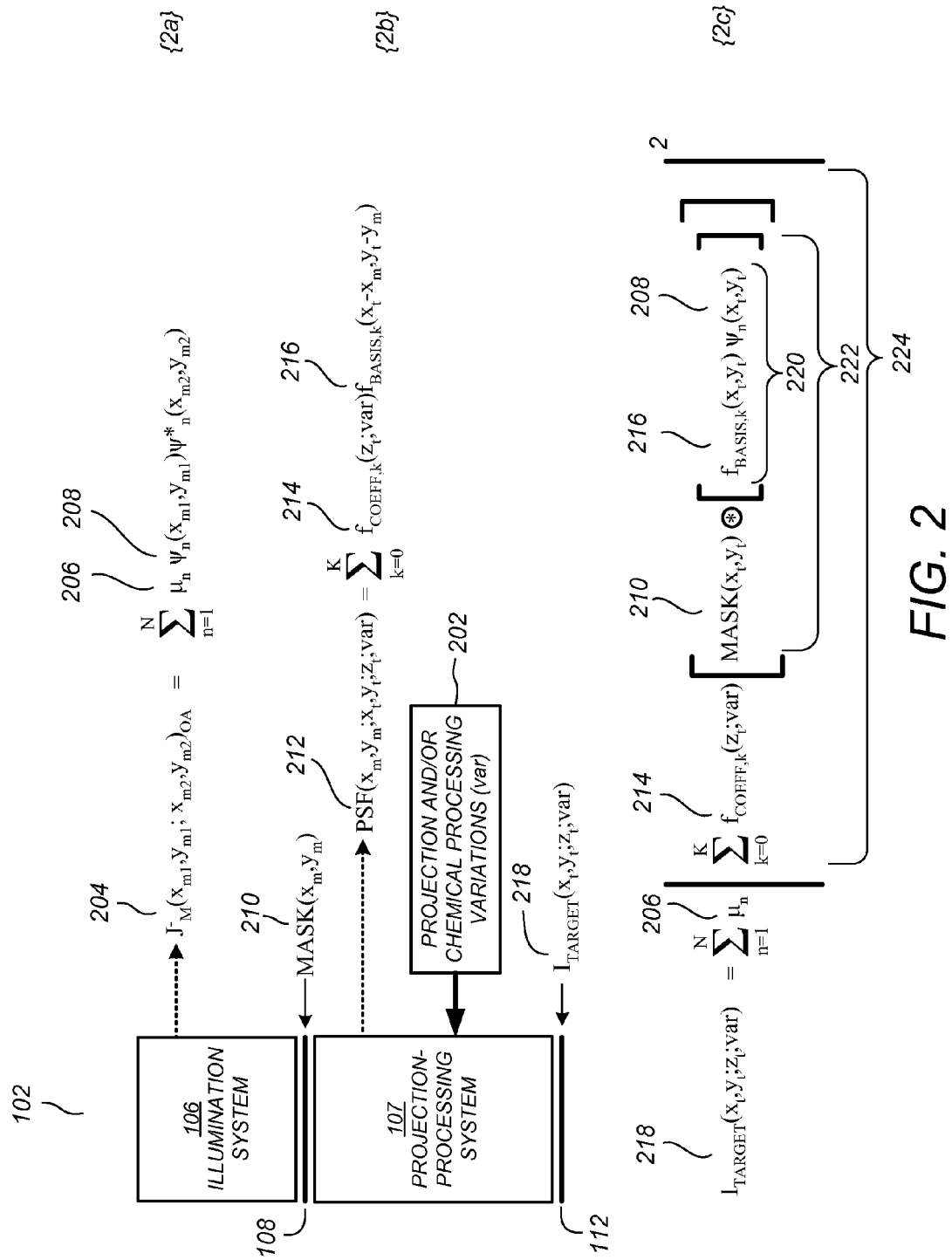

$$I_{TARGET}(x_t,y_t;z_t;var) = \left[\sum_{n=1}^{N}\mu_n \left(\sum_{k=0}^{K}f_{COEFF,k}(z_t;var)MASK(x_t,y_t)\circledast\left(f_{BASIS,k}(x_t,y_t)\psi_n(x_t,y_t)\right)\right)\right]\left[\sum_{k'=0}^{K}f_{COEFF,k'}(z_t;var)MASK(x_t,y_t)\circledast\left(f_{BASIS,k'}(x_t,y_t)\psi_n(x_t,y_t)\right)\right]^* \quad \{3a\}$$

$$I_{TARGET}(x_t,y_t;z_t;var) = \sum_{n=1}^{N}\mu_n \sum_{k=0}^{K}f_{COEFF,k}(z_t;var)\underbrace{\left[MASK(x_t,y_t)\circledast\left(f_{BASIS,k}(x_t,y_t)\psi_n(x_t,y_t)\right)\right]}_{220}\underbrace{\left\{MASK(x_t,y_t)\circledast\left(f_{BASIS,k'}(x_t,y_t)\psi_n(x_t,y_t)\right)\right\}^*}_{222} f^*_{COEFF,k'}(z_t;var) \quad \{3b\}$$

$$CR_{nk}(x_t,y_t) \overset{def}{=} MASK(x_t,y_t) \circledast \left(f_{BASIS,k'}(x_t,y_t)\psi_n(x_t,y_t)\right) \quad \{3c\}$$

$$PI_{kk'}(x_t,y_t) \overset{def}{=} \sum_{n=1}^{N}\mu_n\, CR_{nk}(x_t,y_t)\, CR^*_{nk'}(x_t,y_t) \quad \{3d\}$$

$$I_{TARGET}(x_t,y_t;z_t;var) = \sum_{k=0}^{K}\sum_{k'=0}^{K} f_{COEFF,k}(z_t;var)\, f^*_{COEFF,k'}(z_t;var)\, PI_{kk'}(x_t,y_t) \quad \{3e\}$$

FIG. 3

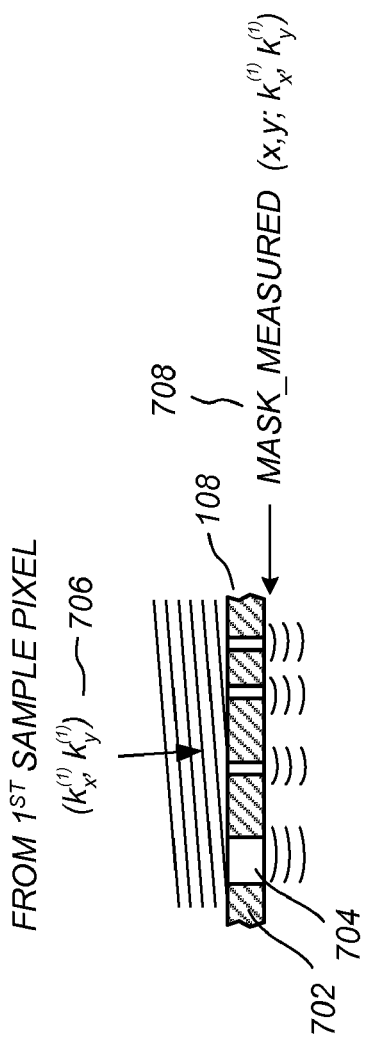
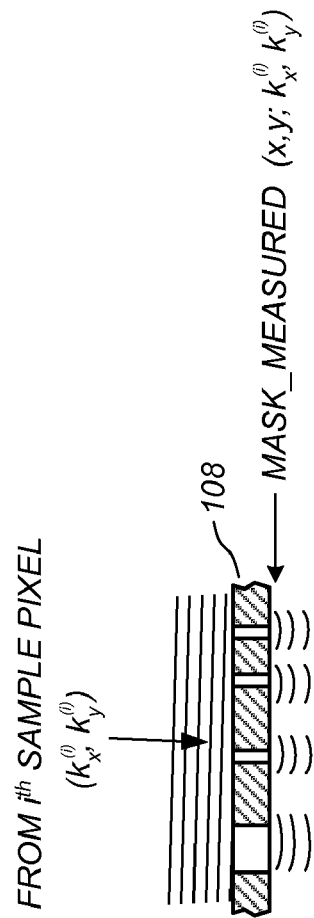

708

$$\text{MASK\_MEASURED}(x,y; k_x^{(1)}, k_y^{(1)}) = e^{j2\pi(k_x^{(1)}x + k_y^{(1)}y)} \underbrace{\left(U_0 + k_x^{(1)}U_1 + k_y^{(1)}U_2\right)}_{802} \quad \{8a\}$$

$$\text{MASK\_MEASURED}(x,y; k_x^{(2)}, k_y^{(2)}) = e^{j2\pi(k_x^{(2)}x + k_y^{(2)}y)} \left(U_0 + k_x^{(2)}U_1 + k_y^{(2)}U_2\right) \quad \{8b\}$$

$$\text{MASK\_MEASURED}(x,y; k_x^{(3)}, k_y^{(3)}) = e^{j2\pi(k_x^{(3)}x + k_y^{(3)}y)} \left(U_0 + k_x^{(3)}U_1 + k_y^{(3)}U_2\right) \quad \{8c\}$$

$$\text{MASK\_PREDICTED}(x,y; k_x, k_y) = e^{j2\pi(k_x x + k_y y)} \underbrace{\left(U_0 + k_x U_1 + k_y U_2\right)}_{802} \quad \{9\}$$

FIG. 9

COMPUTATIONAL EFFICIENCY IN PHOTOLITHOGRAPHIC PROCESS SIMULATION

CROSS-REFERENCE TO RELATED APPLICATIONS

This patent application is a Rule 1.53(b) continuation of U.S. application Ser. No. 12/340,319 filed Dec. 19, 2008, now U.S. Pat. No. 7,788,628 which is a continuation of U.S. application Ser. No. 11/708,444 filed Feb. 20, 2007, now abandoned which is a continuation-in-part of U.S. application Ser. No. 11/705,808, filed Feb. 12, 2007, which is a continuation of U.S. application Ser. No. 11/331,223, filed Jan. 11, 2006, now abandoned. This patent application also claims the benefit of U.S. Provisional Application No. 60/774,329, filed Feb. 17, 2006, and U.S. Provisional Application No. 60/775,385, filed Feb. 21, 2006. Each of the above-referenced patent applications is incorporated by reference herein. The subject matter of U.S. application Ser. No. 11/708,299, filed Feb. 20, 2007 is also incorporated by reference herein.

FIELD

This patent specification relates to computer simulation of photolithographic processes as may be employed, for example, in sub-wavelength integrated circuit fabrication environments.

BACKGROUND

Computer simulation has become an indispensable tool in a wide variety of technical endeavors ranging from the design of aircraft, automobiles, and communications networks to the analysis of biological systems, socioeconomic trends, and plate tectonics. In the field of integrated circuit fabrication, computer simulation has become increasingly important as circuit line widths continue to shrink well below the wavelength of light. In particular, the optical projection of circuit patterns onto semiconductor wafers, during a process known as photolithography, becomes increasingly complicated to predict as pattern sizes shrink well below the wavelength of the light that is used to project the pattern. Historically, when circuit line widths were larger than the light wavelength, a desired circuit pattern was directly written to an optical mask, the mask was illuminated and projected toward the wafer, the circuit pattern was faithfully recorded in a layer of photoresist on the wafer, and, after chemical processing, the circuit pattern was faithfully realized in physical form on the wafer. However, for sub-wavelength circuit line widths, it becomes necessary to "correct" or pre-compensate the mask pattern in order for the desired circuit pattern to be properly recorded into the photoresist layer and/or for the proper physical form of the circuit pattern to appear on the wafer after chemical processing. Unfortunately, the required "corrections" or pre-compensations are themselves difficult to refine and, although there are some basic pre-compensation rules that a human designer can start with, the pre-compensation process is usually iterative (i.e., trial and error) and pattern-specific to the particular desired circuit pattern.

Because human refinement and physical trial-and-error quickly become prohibitively expensive, optical proximity correction (OPC) software tools have been developed that automate the process of pre-compensating a desired circuit pattern before it is physically written onto a mask. Starting with the known, desired circuit pattern, an initial mask design is generated using a set of pre-compensation rules. For the initial mask design, together with a set of process conditions for an actual photolithographic processing system (e.g., a set of illumination/projection conditions for a "stepper" and a set of chemical processing conditions), a simulation is performed that generates a simulated image of the pattern that would appear on the wafer after the photoresist was exposed and chemically processed. The simulated image is compared to the desired circuit pattern, and deviations from the desired circuit pattern are determined. The mask design is then modified based on the deviations, and the simulation is repeated for the modified mask design. Deviations from the desired circuit pattern are again determined, and so on, the mask design being iteratively modified until the simulated image agrees with the desired circuit pattern to within an acceptable tolerance. The accuracy of the simulated image is, of course, crucial in obtaining OPC-generated mask designs that lead to acceptable results in the actual production stepper machines and chemical processing systems of the actual integrated circuit fabrication environments.

Photolithographic process simulation generally comprises optical exposure simulation and chemical processing simulation. During optical exposure simulation, the operation of a photolithographic processing system (e.g., stepper) is simulated to compute an optical intensity pattern in the photoresist. The computed optical intensity can be purely two-dimensional, i.e., a function of two variables that treats the photoresist layer as a single plane. Alternatively, the optical exposure simulation can treat the photoresist layer as a volume, and compute two-dimensional optical intensities for a plurality of planar levels within the photoresist volume. In still another alternative, the optical exposure simulation can provide a three-dimensional optical intensity.

During chemical processing simulation, the effects of chemical processing (which may include, for example, treating the exposed/unexposed resist, washing away the exposed/unexposed resist, wet or dry etching, etc.) are simulated to compute a resultant intensity pattern in the resist and/or the wafer. In some cases the chemical processing simulation is carried out in a very simple manner, such as by simply thresholding a purely two-dimensional optical intensity pattern by a fixed, predetermined value to generate a resultant intensity that is a binary or continuous pattern. In other cases, the chemical processing simulation can be more complex by processing the optical intensity pattern in location-dependent, pattern-dependent, or depth-dependent manners, or in other ways. In still other cases, such as during the design or troubleshooting of the stepper machines themselves by a stepper machine manufacturer, the chemical processing simulation is omitted altogether (i.e., is a null step in the photolithographic process simulation), with the two-dimensional or three-dimensional optical intensity pattern itself being of primary interest to the user.

For purposes of clarity and not by way of limitation, the output of an optical exposure simulation is referenced herein as an optical intensity. As used herein, resultant intensity refers to the output of an overall photolithographic process simulation. In cases where the chemical processing simulation is a null step in the overall photolithographic process simulation, the resultant intensity corresponds to an optical intensity. Depending on the particular need, the resultant intensity can represent any of a variety of different images or physical quantities including, but not limited to, an optical intensity, an aerial image, a latent image in a resist film, a developed resist pattern, a final semiconductor pattern, and an etch depth profile within a final semiconductor.

It is crucial to accurately compute the optical intensity pattern in the photoresist and to accurately compute the chemical processing effects in order to enable the overall photolithographic process simulation result to be accurate. In addition to the OPC software context, accurate photolithographic process simulation is also useful in other contexts including, but not limited to, resolution enhancement techniques (RETs) additional to OPCs, in which the effectiveness of a particular RET strategy can be verified by simulation.

One or more issues arise in relation to the simulation of a photolithographic process, at least one of which is resolved by at least one of the preferred embodiments described herein. It is to be appreciated, however, that the scope of the preferred embodiments is also widely applicable to a variety of different optical exposure processes, with or without subsequent chemical processing steps, and is not limited to the particular environment of integrated circuit fabrication. One key issue relates to computation time. For example, as indicated in US2005/0015233A1, which is incorporated by reference herein, computation of a single optical intensity for a single resist plane and a single set of process conditions using conventional methods can take hours or even days. In practice, it is often desired to compute the optical intensity for many different values of one or more exposure system variations, and/or to compute the optical intensity for many different resist planes. It is further often desired to compute the resultant intensity for many different values of one or more exposure system or chemical processing system variations, and/or to compute the resultant intensity for many different planes within the photoresist layer or the processed wafer. This can drastically increase the already-substantial computation time in order to compute the desired overall set of results.

Another issue that arises in photolithographic process simulation relates to properly simulating the effects of interactions between the optical mask itself and the exposure light that is passing through the optical mask. As known in the art, an optical mask (also termed a photolithographic mask or photomask) typically comprises an optically transparent substrate supporting an opaque material layer into which patterns of voids (or patterns of less-opaque materials) are formed. Although the opaque material layer is indeed very thin, it generally needs to have a thickness on the order of the wavelength of the exposure light for sufficient absorptance. However, as line widths continue to shrink below the wavelength of the exposure light, the voids (or patterns of less-opaque material) assume increasingly higher aspect ratios, reminiscent of canyons that get narrower and narrower while their canyon walls remain the same height. In turn, this affects the manner in which the optical mask responds to exposure light wavefronts arriving from off-normal angles, and this varying response can be a source of error for simulations that do not properly not take this effect into account. Other issues arise as would be apparent to one skilled in the art upon reading the present disclosure.

SUMMARY

A method, system, related computer program products, and related computer-readable numerical arrays for computer simulation of a photolithographic process are provided in which fast computation of a resultant intensity for a large number of process variations and/or target depths is achieved. The photolithographic processing system that is being simulated comprises an illumination system, a projection system, and a chemical processing system. The illumination system is characterized for simulation purposes by a plurality of modes impingent upon a mask and a corresponding set of mode weights. The projection system and chemical processing system, which are collectively termed a projection processing system herein, are collectively subject to at least one process variation (var). According to a preferred embodiment, for any particular combination of values for the at least one process variation and the target depth ($var, z_t$), the projection processing system can be characterized by a series expansion comprising a plurality of predetermined basis spatial functions as weighted by a corresponding plurality of expansion coefficients, wherein the predetermined basis spatial functions are not dependent on either the at least one process variation or the target depth, and wherein the expansion coefficients are dependent on the at least one process variation and/or target depth ($var, z_t$).

According to one preferred embodiment, a plurality of model kernels are computed, each model kernel corresponding to a product of one of the basis spatial functions and one of the modes of the illumination system. A plurality of convolution results are then computed by convolving a mask transmittance function of the mask with each of the model kernels. The method further comprises computing a plurality of partial intensity functions, each partial intensity function corresponding to a first subset of the convolution results associated with a first of the basis spatial functions and a second subset of the convolution results associated with a second of the basis spatial functions, each partial intensity function computed as a modewise weighted sum of the products of respective members of the first and second subsets.

Advantageously, subsequent to computation of the partial intensity functions, the resultant intensity for a large number of process variations and/or target depths ($var, z_t$) can be computed without requiring any additional convolution operations involving the mask transmittance function or model kernels. For one preferred embodiment, for each of a plurality of distinct value sets ($var, z_t$), a point spread function of the projection processing system is determined for that value set ($var, z_t$). That point spread function and the predetermined basis spatial functions are then processed to compute appropriate expansion coefficient values for which the predetermined basis spatial functions approximate that point spread function when weighted by respective ones of the expansion coefficients and then accumulated. A resultant intensity is then computed as a sum of the partial intensity functions as weighted according to corresponding pairs of the expansion coefficients.

Also provided is a method for simulating a photolithographic process carried out by a photolithographic processing system having an illumination system and a projection-processing system, the illumination system including a source having a regional cluster of radiating pixels. Information is received that is representative of a photomask having a geometrical layout and a three-dimensional topography of thin-film materials. Based on the geometrical layout and three-dimensional topography, a predicted mask transmittance function is computed for the regional cluster that is at least partially dependent on an illumination incidence angle from each of the radiating pixels, the predicted mask transmittance function comprising a plurality of basis mask transmittance functions (MTFs) that are not dependent on the incidence angle and a corresponding plurality of expansion coefficients that are at least partially dependent on the illumination incidence angle. A resultant intensity is computed that corresponds to an application of the illumination system and the projection-processing system to a notional mask having that predicted mask transmittance function. Optionally, the source can be characterized as a plurality of regional clusters of radiating pixels, wherein a separate incidence-angle dependent predicted mask transmittance function is computed for each separate regional cluster, a separate resultant intensity is computed that corresponds to an application of the illumination system and the projection-processing system to a notional mask having that separate incidence-angle dependent predicted mask transmittance function, and an overall resultant intensity for the photomask as an sum of all of the separate resultant intensities.

According to another preferred embodiment, a method for predicting a mask transmittance function for an arbitrary illumination incidence angle for a photomask having a geometrical layout and a three-dimensional topography of thin-film materials is provided. First information is received and/or computed that is representative of a plurality of wavefront functions emanating from the photomask responsive to illumination incident from a respective plurality of calibration incidence angles. The first information is then used to compute a predicted mask transmittance function as a series expansion comprising a plurality of basis mask transmittance functions (MTFs) that are not dependent on the incidence angle and a corresponding plurality of expansion coefficients that are at least partially dependent on the incidence angle. The wavefront functions emanating from the photomask can be determined using wave-scattering simulation software and/or physical measurement of an optical apparatus in which illumination at each calibration incidence angle impinges upon a physical version of the photomask

BRIEF DESCRIPTION OF THE DRAWINGS

FIG. 1A illustrates a photolithographic processing system for simulation according to a preferred embodiment;

FIG. 1B illustrates a perspective view of the photolithographic processing system of FIG. 1A;

FIG. 2 illustrates the photolithographic processing system of FIGS. 1A-1B with projection system process variations and/or chemical processing system variations and expressions relating to describing photolithographic process simulation according to a preferred embodiment;

FIG. 3 illustrates expressions relating to describing photolithographic process simulation according to a preferred embodiment;

FIGS. 7A-7B illustrate conceptual side cut-away views of a small portion of a photomask, illumination beams impingent thereon, and radiation wavefronts emanating therefrom to be computed and/or measured in determining a predicted mask transmittance function according to a preferred embodiment;

FIG. 8 illustrates expressions relating to computation of basis mask transmittance functions according to a preferred embodiment; and FIG. 9 illustrates an expression for a predicted mask transmittance function according to a preferred embodiment.

DETAILED DESCRIPTION

Figure 4:
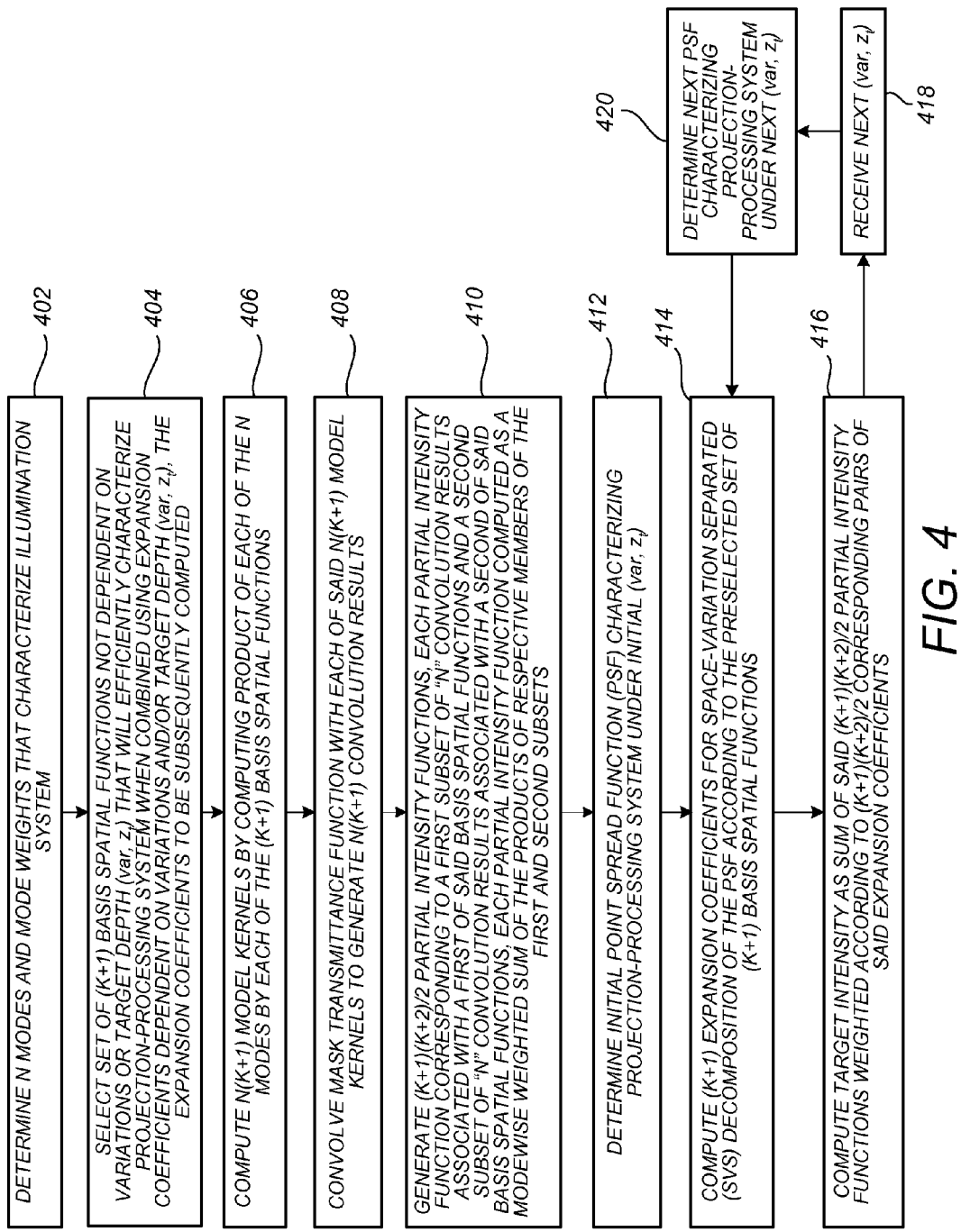
FIG. 4 illustrates simulating a photolithographic process according to a preferred embodiment.

FIG. 1A illustrates a simplified representation of a photolithographic processing system 102 for computer simulation according to one or more of the preferred embodiments described herein. Photolithographic processing system 102 comprises an optical exposure system 105 and a chemical processing system 114. Optical exposure system 105 comprises an illumination system 106 that illuminates a mask 108, such as a photolithographic mask, and a projection system 110 that projects the illuminated mask toward a target 112 to expose the target 112. The illumination system 106 includes an optical source 104. The optical exposure system 105 may represent a photolithographic stepper machine ("stepper"), and the target 112 can be a semiconductor wafer covered with photoresist ("resist"), although the scope of the present teachings is not so limited.

Chemical processing system 114 comprises devices that chemically process the target 112 after exposure, and also represents the photochemical reaction of resist molecules upon absorption of exposure photons. Subsequent to the exposure process, the chemical processing is often performed after the target 112 has been physically removed from the optical exposure system 105. For clarity of presentation and not by way of limitation, the chemical processing system 114 is conceptually illustrated by an enlarged arrow beneath the projection system 110 in FIG. 1A.

Prior to chemical processing (i.e., above the enlarged arrow in FIG. 1A) the effects of the photolithographic system 102 on the target 112 can be characterized by an optical intensity pattern. As used herein, an optical intensity value can be a time-constant or time-varying instantaneous value and/or can be a time integral of the instantaneous value. Subsequent to chemical processing (i.e., below the enlarged arrow in FIG. 1A) the effects of the photolithographic system 102 on the target 112 can be characterized by a resultant intensity pattern corresponding to any of a variety of physical results including, but not limited to, an aerial image, a latent resist image, a developed resist pattern, a final semiconductor pattern, and an etch depth profile within a final semiconductor. If the chemical processing is a null step (i.e., if chemical processing system 114 is not present or turned off), the resultant intensity for the target 112 corresponds to the optical intensity for the target 112.

In general, the simulation process comprises receiving known physical parameters of the photolithographic processing system 102, generating mathematical models that represent its operation, and applying those mathematical models to proposed transmittance functions of the mask 108 to compute resultant intensities. For purposes of generality, the target 112 is illustrated in FIG. 1A as a volumetric object. However, it is to be appreciated that optical intensities and resultant intensities can be either two-dimensional profiles for single planes thereon or therein, or can be three-dimensional profiles for the entire volume or a subvolume therein.

Among the advantages of at least one of the preferred embodiments described herein, easier computation of $I_{TARGET}(x_t, y_t; z_t; \text{var})$ is provided, where $z_t$ represents a target depth into the target 112, and where var represents one or more process variations. Process variations include optical exposure system variations for the optical exposure system 105 and chemical processing variations for the chemical processing system 114. Optical exposure system variations include illumination system variations for the illumination system 106 and projection system variations for the projection system 110. Examples of illumination system variations include, but are not limited to, intensity/position variations of multiple emitters, source chromatic variations, coherence variations, and source positioning variations. Examples of projection system variations include, but are not limited to, defocus variations, lens aberrations, immersion medium refractive index variations, immersion medium attenuation coefficient variations, stack film thickness variations, stack film material refractive index variations, and stack film material attenuation coefficient variations. A defocus variation can arise, for example, from mechanical errors in the vertical position of a wafer-supporting platform in a stepper machine relative to the optics of the projection system 110. Examples of chemical processing variations include, but are not limited to, resist development variations and chemical etching process variations. Although just the single term "var" is often used herein to denote process variations, it is to be appreciated that "var" can represent a plurality of process variations var1, var2, var3, etc.

As used herein, value of a process variation refers broadly to any quantitative descriptor, index, or indicator reflecting an amount, degree, class, type, magnitude, direction, nature, or other characteristic associated with the process variation. Although in many cases the value of a process variation will be a scalar number (e.g., a scalar distance metric for the case of defocus variations), in other cases the value of a process variation may be a vector or multidimensional expression, an index into a lookup table, a percentage, a color, a shape, or other indicator, including a null value if the particular process variation does not exist, has no effect, or is not to be considered. It is to be appreciated that a value of a process variation, as that term is used herein, might only be abstractly related to the physical underpinnings of the process variation itself, provided only that some kind of change in the process variation is associated with some kind of change in the value.

As previously described for one or more preferred embodiments of U.S. Ser. No. 11/331,223, supra, and as also applied for one or more preferred embodiments herein, the projection system 110 and chemical processing system 114 may be jointly characterized by a point spread function that incorporates one or more variations of the projection system 110 and/or chemical processing system 114 and/or one or more target depths $z_t$. For clarity of disclosure herein, and without loss of generality, projection system 110 and chemical processing system 114 are collectively referenced herein as a "projection processing system" 107. The projection processing system 107 may be characterized by a point spread function that incorporates one or more variations and/or one or more target depths $z_t$. If the chemical processing is a null step (i.e., if chemical processing system 114 is not present or turned off), the projection processing system 107 simply refers to the projection system 110, and the variations necessarily consist of projection system variations.

According to one of the computational advantages of at least one of the preferred embodiments described herein, the number of computationally expensive convolutions of the mask transmittance function with model kernels does not increase with the number of different value combinations for one or more process variations and/or target depths for which target intensity results are desired. Instead, according to at least one of the preferred embodiments herein, only a single set of convolutions of the mask transmittance function with model kernels is required for computing target intensity results for a number of different value combinations for the one or more process variations and/or target depths. Once this single set of convolutions is computed for a first value combination (for example, var=[$defocus_1$,$aberration_1$] together with depth=$depth_1$), the same convolution results are then combined differently according to variation-dependent and/or depth-dependent weights for generating results for different value combination (for example, var=[$defocus_2$,$aberration_2$] together with depth=$depth_2$). Notably, combining the same convolution results with differing weights is substantially less computationally intensive than generating different convolution results for each different process variation value and/or target depth. Accordingly, when simulating a photolithographic process according to one or more of the preferred embodiments, substantial computation time is saved when resultant intensities are desired for several different value combinations for the one or more process variations and/or target depths.

For one or more of the preferred embodiments described herein, for an initial process variation value and/or an initial target depth, the number of model kernels with which the mask transmittance function is convolved can be larger than a number of optical kernels used in one or more prior art methods. Accordingly, for any particular mask transmittance function, if only a single aerial image is desired for a single process variation value for a single target depth, the computational advantages may not be readily apparent. However, for the more prevalent case in which results for several process variation values and/or target depths are desired, drastic computational advantages over the one or more prior art methods are realized.

Referring again to FIG. 1A, coordinates $(x_s, y_s)$ are used for the plane of the source 104, coordinates $(x_m, y_m)$ are used for the plane of the mask 108, and coordinates $(x_t, y_t)$ or $(x_t, y_t, z_t)$ are used for the target 112. FIG. 1B illustrates a conceptual view of the optical source 104, the mask 108, and the target 112. For clarity of presentation, image reversal and image reduction (e.g., 4:1) associated with the projection system 110 are not included in FIG. 1B and herein, as a person skilled in the art would be readily able to implement the preferred embodiments factoring in the appropriate image reversal/reduction in view of the present disclosure.

FIG. 1B illustrates the mask 108 and target 112 as subdivided for computational purposes into mask segments 119 and target segments 121, respectively. As known in the art, adjacent ones of mask segments 119 and target segments 121 may have slight overlaps according to an optical ambit of the projection system 110 and diffusion radius of the chemical processing system 114, respectively. Due to the spatially-limited optical ambit of the projection system 110, any particular one of the mask segments 119 (e.g., an exemplary mask segment 120) can be processed separately from the other mask segments 119 to compute a resultant intensity at a corresponding target segment 121 (e.g., an exemplary target segment 122 corresponding to the exemplary mask segment 120). By way of example, and not by way of limitation, for photolithographic simulation for chips of size $(1\ mm)^2$ to $(10\ mm)^2$ there may be between $(100)^2$ and $(1000)^2$ mask segments 119 and corresponding target segments 121, each having a size of about $(10\ \mu m)^2$. In turn, each mask segment 119 may comprise M×M numerical values representing mask transmittances within that segment, with M being about 100-1000, with resultant intensity values being computed for each of M×M corresponding target segment locations. Another suitable representation for the mask 108 is binary or phased polygons specified by coordinates of vertices. Typical sampling grid spacing for both mask and target may be on the order of 10-100 nm. The optical ambit for such cases may be on the order of 1 µm, corresponding to between 10 sample points and 100 sample points along each dimension. It is to be appreciated, however, that such computational array sizes and sampling grids are highly dependent on the particular nature of the exposure process being simulated, the type and speed of computing hardware being used, and other factors, and therefore can vary by orders of magnitude without departing from the scope of the preferred embodiments.

The computations for the different mask segments 119 and their corresponding target segments 121 can be performed separately and in parallel on separate computing devices to reduce the overall simulation time required. Under an assumption of global shift-invariance of the optical exposure system 105, the different computing devices can be programmed with the same simulation algorithm. However, the scope of the preferred embodiments is not limited to the use of the same simulation algorithm for different mask segments. Moreover, the scope of the preferred embodiments can include scenarios in which different mask segments are of different size and/or shape. As illustrated in FIG. 1B, the exposure process can be conceptually broken down into the illumination of an exemplary mask segment 120 by the illumination system 106, and the projection of the illuminated mask segment 120 onto the corresponding target segment 122.

FIG. 2 illustrates the photolithographic processing system 102 of FIGS. 1A-1B with projection system process variations and/or chemical processing system variations 202 (i.e., projection processing system variations 202) and expressions relating to describing photolithographic process simulation according to a preferred embodiment. FIG. 2 represents a summary of relationships according to certain of the preferred embodiments of U.S. Ser. No. 11/331,223, supra, which are taken further in the present description to even more efficiently compute resultant intensities across a large range of values for projection processing system variations and/or target depths $(var,z_t)$.

With reference to Eq. {2a}, the illumination system 106 may be characterized by a plurality of modes 208 and a respective plurality of mode weights 206 representative of a mutual intensity 204 impingent upon the mask 108 being illuminated. The modes 208 are represented by a different symbol ($\psi$) than the coherent modes ($\xi$) discussed U.S. Ser. No. 11/331,223, supra, to indicate more generality in the way the illumination system 106 may be decomposed and characterized, as well as the extended applicability of simulation formulations other than the Hopkins formulation (e.g., the Abbe formulation) in one or more of the preferred embodiments. For many practical simulation scenarios, the number of modes "N" can be between about 10 and 100, although the scope of the preferred embodiments is not so limited. The mask 108 is characterized by a mask transmittance function 210.

With reference to Eq. {2b}, the projection-processing system 107 may be characterized by a point spread function 212 that incorporates one or more variations (var) and/or one or more target depths $(z_t)$. The point spread function 212 may be generated analytically and/or numerically to depend on both spatial coordinates and $(var,z_t)$ according to the physics of the stepper machine, as described elsewhere in the present specification and U.S. Ser. No. 11/331,223, supra. Many computational advantages are gained, however, by a prudent preselection of a plurality of basis spatial functions 216 not dependent on either of $(var,z_t)$ that efficiently characterize the projection-processing system response in conjunction with suitable expansion coefficients 214 that are dependent on var and/or $z_t$, as set forth in Eq. {2b}. For many practical simulation scenarios, the number of basis spatial functions (K+1) can be between about 4 and 10. For other practical simulation scenarios, the number of basis spatial functions (K+1) can be between about 2 and 20, although the scope of the preferred embodiments is not so limited.

With reference to Eq. {2c}, the resultant target intensity 218 can be efficiently computed for different combinations of $(var,z_t)$ by first performing the steps of (i) computing a plurality N(K+1) of model kernels 220, each model kernel 220 corresponding to a product of one of the (K+1) basis spatial functions 216 and one of the N modes 208, (ii) computing a plurality N(K+1) of convolution results 222 corresponding to a convolution of the mask transmittance function 210 with each of the model kernels 220. Once these N(K+1) convolution results are computed, then resultant intensities for a number of combinations of $(var,z_t)$ can be computed without requiring any additional convolution operations involving the mask transmittance function, which are very computationally intensive. More specifically, for each combination of $(var,z_t)$, the point spread function 212 can be computed/determined, and then the (K+1) expansion coefficients 214 can be computed based on inner products of the basis spatial functions 216 with the point spread function 212. Then resultant intensity 218 for that combination of $(var,z_t)$ can be computed by computing the sum 224 for each value of "n" (i.e., for each of N modes), squaring that sum 224, and computing a sum of the squares as weighted by the mode weights 206. For any particular target point, the operations of Eq. {2c} require essentially (K+1) multiplies and adds for each of the N modes, for a computational complexity of essentially N(K+1) for each target point. Thus, to compute the resultant intensity for "S" selected target points, the total computational complexity for the operations of Eq. {2c} is N(K+1)S.

Although the method outlined in FIG. 2 is far superior to methods that would require mask transmittance function re-convolutions for each different combination of $(var,z_t)$, it would be even better to further reduce the number of computations required for each different combination of $(var,z_t)$ in view of the high practical desirability of, and many different uses for, resultant intensities computed across extremely large numbers of different combinations of $(var,z_t)$ according to the preferred embodiments. It has been found that the number of computations for each different combination of $(var,z_t)$ can be further reduced in view of the typically smaller number of basis spatial functions (K+1) (e.g., between about 4-10) compared to the typically larger number of modes N (e.g., between about 10-100) associated with many practical implementations.

FIG. 3 illustrates expressions relating to describing photolithographic process simulation according to a preferred embodiment. Eqs. {3a}-{3b} are mathematical identities with Eq. {2c}, supra, after summation expansions and rearrangement of terms. With reference to Eqs. {3b}-{3e}, the target intensity 218 can equivalently be computed by computing a plurality (K+1)(K+1) partial intensity functions 302 and then computing their sum as weighted by products of corresponding pairs of the expansion coefficients 214/214a. More particularly, each partial intensity function, having an index of kk', is weighted by a product of the $k^{th}$ expansion coefficient and the conjugate of the $k'^{th}$ expansion coefficient to compute the resultant intensity 218.

To compute the partial intensity functions, the N(K+1) model kernels 220 and N(K+1) convolution results 222 are computed in a manner similar to the preferred embodiment of FIG. 2, supra. Then each partial intensity function, having an index of kk', is computed as a modewise weighted sum of the products of respective members of (i) a $k^{th}$ subset of the convolution results associated with the $k^{th}$ basis spatial function, and (ii) the conjugate of a $k'^{th}$ subset of the convolution results associated with the $k'^{th}$ basis spatial function.

FIG. 4 illustrates simulating a photolithographic process according to a preferred embodiment. At step 402, N modes 208 and N mode weights 206 associated with the illumination system 106 are determined. At step 404, a set of (K+1) basis spatial functions 216 not dependent on projection processing system variations or target depth $(var,z_t)$ are retrieved from computer memory or otherwise identified that will efficiently characterize the projection processing system 107 when combined using expansion coefficients 214 that are dependent on at least one of (var,$z_t$), the expansion coefficients 214 to be later computed for any particular combination of (var,$z_t$). This characterization can be termed a space-variation separated (SVS) decomposition, since the basis spatial functions depend on space but not (var) or $z_t$, and since the expansion coefficients depend on (var) or $z_t$ but not on space.

At step 406, N(K+1) model kernels 220 are computed by computing a product of each of the N modes 208 with each of the (K+1) basis spatial functions 216. At step 408, the mask transmittance function 210 is convolved with each of the N(K+1) model kernels 220 to generate N(K+1) convolution results 222. At step 410, (K+1)(K+2)/2 partial intensity functions 302 are generated, each partial intensity function corresponding to a first subset of N convolution results 222 associated with a first of the basis spatial functions and a second subset of N convolution results associated with a second of the basis spatial functions, each partial intensity function computed as a modewise weighted sum of the products of respective members of the first and second subsets. At step 412, an initial point spread function characterizing the projection processing system under an initial (var,$z_t$) is determined. At step 414, (K+1) expansion coefficients 214 for the SVS decomposition of that point spread function are computed using the preselected basis spatial functions, in particular by computing inner products of the basis spatial functions and that point spread function.

At step 416, the target intensity for the present (var,$z_t$) is determined as a sum of the (K+1)(K+2)/2 partial intensity functions 302 as weighted according to (K+1)(K+2)/2 corresponding pairs of expansion coefficients 214/214$a$. At step 418, a next combination of values for (var, $z_t$) is received. At step 420, a next point spread function characterizing the projection processing system under the next (var,$z_t$) is determined. The steps 414-420 are then repeated for as many different combinations of (var,$z_t$) as may be desired.

Figure 5:
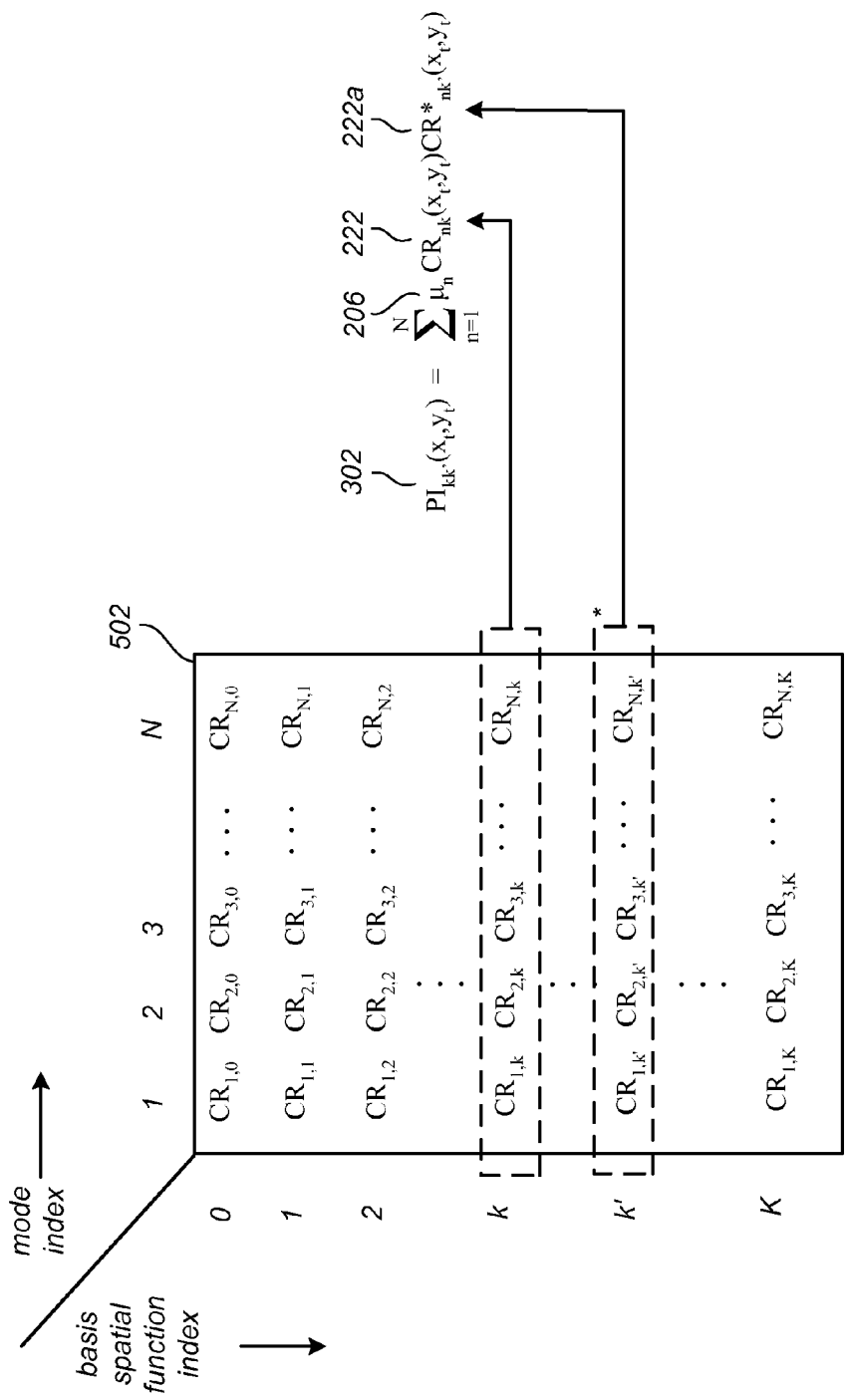
FIG. 5 illustrates a plurality of convolution results and an expression based thereon for computing a plurality of partial intensity functions according to a preferred embodiment.

FIG. 5 illustrates a conceptual table 502 of a plurality N(K+1) of the convolution results 222 and a repeated version of the partial intensity computation equation {3d} adjacent thereto. Any particular row k of the table 502 comprises a $k^{th}$ subset of convolution results associated with the $k^{th}$ basis spatial function in that the $k^{th}$ subset of convolution results resulted from a convolution of the mask transmittance function with a subset of model kernels comprising the respective products of each mode times that $k^{th}$ basis spatial function. Thus, each partial intensity function 302, indexed by kk', corresponds to a first ($k^{th}$) subset of N convolution results associated with a first ($k^{th}$) of the basis spatial functions and a second ($k'^{th}$) subset of N convolution results associated with a second ($k'^{th}$) of the basis spatial functions, each partial intensity function computed as a modewise weighted sum (i.e., summed along the mode index n from 1 to N as weighted by the mode weights $\mu_n$) of the products of respective members of the first and second subsets (i.e., the $n^{th}$ member of the first subset times the $n^{th}$ member of the second subset), wherein each member 222$a$ of the second subset is conjugated in the modewise weighted sum.

Figure 6:
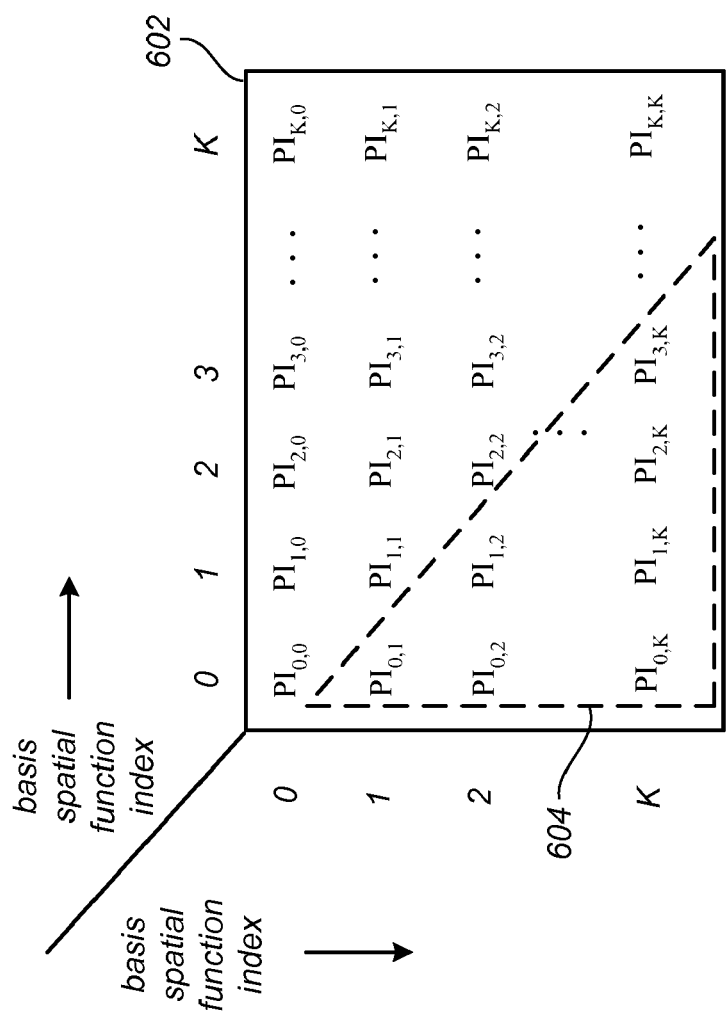
FIG. 6 illustrates a plurality of partial intensity functions according to a preferred embodiment.

FIG. 6 illustrates a conceptual table 602 of (K+1)(K+1) partial intensities 302 associated with a particular set of convolution results, with each dimension of the table 602 being indexed by a basis spatial function index. By virtue of a symmetry around the diagonal of table 602, characterized in that the partial intensities 604 below the diagonal are complex conjugates of respective partial intensities on the upper side of the diagonal, it is not necessary to separately compute the partial intensities 604, and instead it is only necessary to compute the (K+1)(K+2)/2 other members of the table 604. Due to a similar symmetry of the expansion coefficients, computing the resultant intensity for S selected target points for a particular combination (var,$z_t$) (subsequent to computation of the expansion coefficients) consists essentially of (i) (K+1)(K+2)/2 multiplies of the expansion coefficients with their conjugates to generate (K+1)(K+2)/2 weights, plus (ii) (K+1)(K+2)S/2 multiplies for weighting the partial intensity function with those weights, plus (iii) (K+1)(K+2)S/2 adds for adding the weighted partial intensity functions. For comparison purposes with the preferred embodiment of FIG. 2 at Eq. {2c}, this essentially amounts to a computational complexity of (K+1)(K+2)S/2, which is less than N(K+1)S when (K+1) is less than 2N−1. Accordingly, the computational algorithm of FIGS. 3-6 is preferable to the computational algorithm of FIG. 2 when (K+1) is less than 2N−1, and for many practical realizations in which (K+1) is between about 4-10 and N is between about 10-100, there is very substantial computational savings using the computational algorithm of FIGS. 3-6.

FIGS. 7A-7B illustrate conceptual side cut-away views of a small portion of a photomask 108 and illumination beams impingent thereon from different incident angles. FIG. 8 illustrates expressions relating to computation of basis mask transmittance functions according to a preferred embodiment. FIG. 9 illustrates an expression for a predicted mask transmittance function according to a preferred embodiment.

Shown in FIG. 7A is an illumination beam associated with a first sample "pixel" of an illumination source. It is to be understood that the term "pixel" in this context is used for convenience and clarity of explanation to refer to a small contiguous segment of the illumination source, regardless of whether that illumination source is actually pixelized in nature. The illumination beam is incident at an angle that may be expressed in terms of a wave vector ($k_x,k_y$) of the incident plane waves arriving at the photomask 108. The photomask 108 has a geometrical layout and a three-dimensional topography of thin-film materials. The thin-film materials have various optical properties (permittivity, permeability, refractive index, etc.) and are configured in a manner that is directed to the general goal of allowing light to pass through at certain locations 704 and not allowing light to pass through at other locations 702.

According to a preferred embodiment, a method and related computer program product is provided for predicting a mask transmittance function for an arbitrary illumination incidence angle for the photomask 108. The computer program product may be useful as a stand-alone utility, may be integrated into a larger photolithographic simulation computer program product, or may be otherwise incorporated into simulation products such as by plug-in or other modular functional relationship. According to one preferred embodiment, information representative of a plurality of wavefront functions 708 (e.g., MASK_MEASURED(x,y; $k_x^{(i)},k_y^{(i)}$), as indexed by the counter variable "i") emanating from the photomask responsive to illumination incident from a respective plurality of calibration incidence angles ($k_x^{(i)},k_y^{(i)}$) is received. This information is then used to compute the predicted mask transmittance function 902 (e.g., MASK_PREDICTED(x,y; $k_x,k_y$)) as a series expansion comprising a plurality of basis mask transmittance functions (MTFs) 802 ($U_0, U_1, U_2$) that are not dependent on the incidence angle ($k_x,k_y$) and a corresponding plurality of expansion coefficients that are at least partially dependent on the incidence angle ($k_x,k_y$). Eqs. {8a}-{8c} of FIG. 8 illustrate an example for a first order series expansion in which there are three different calibration incidence angles, three corresponding measured wavefront functions 708, and three pre-selected expansion coefficients $\exp[j2\pi(k_xx+k_yy)]$, $\exp[j2\pi(k_xx+k_yy)]k_x$, and $\exp[j2\pi(k_xx+$ $k_y, y)]k_y$, providing three equations which can be solved for the three unknown basis MTFs $U_0$, $U_1$, and $U_2$. Higher-order expansions are also within the scope of the preferred embodiments.

For one preferred embodiment, the wavefront functions 708 emanating from the photomask 108 are computed using wave-scattering simulation software. For another preferred embodiment, the wavefront functions 708 emanating from the photomask 108 are determined by physical measurement in an optical apparatus in which illumination at the calibration incidence angle impinges upon a physical version of the photomask 108.

According to another preferred embodiment, a method for simulating a photolithographic process is provided that takes into account the presence of different mask transmittance functions for different illumination angles. The simulation is for a photolithographic process carried out by a photolithographic processing system having an illumination system and a projection-processing system. The illumination system includes a source having a regional cluster of radiating pixels. First information representative of a photomask having a geometrical layout and a three-dimensional topography of thin-film materials is received. The first information is used to compute a predicted mask transmittance function applicable for the regional cluster that is at least partially dependent on an illumination incidence angle from each of the radiating pixels, wherein the predicted mask transmittance function comprises a plurality of basis mask transmittance functions (MTFs) that are not dependent on the incidence angle and a corresponding plurality of expansion coefficients that are at least partially dependent on the illumination incidence angle. A resultant intensity corresponding to an application of the illumination system and the projection-processing system to a notional mask having the predicted mask transmittance function is then computed.

According to another preferred embodiment, the source may comprise multiple regional clusters of radiating pixels. A predicted mask transmittance function is computed for each of the multiple regional clusters of radiating pixels, each predicted mask transmittance function comprising a plurality of basis mask transmittance functions (MTFs) that are not dependent on an illumination incidence angle from the radiating pixels for that regional cluster and a corresponding plurality of expansion coefficients at least partially dependent on that illumination incidence angle. For each regional cluster a resultant intensity is computed, and then an overall resultant intensity for the photomask is computed as a sum of the multiple resultant intensities. The multiple resultant intensities may be computed using computer code that is based on an Abbe formulation, a Hopkins formulation, or other formulation.

Whereas many alterations and modifications of the present invention will no doubt become apparent to a person of ordinary skill in the art after having read the descriptions herein, it is to be understood that the particular preferred embodiments shown and described by way of illustration are in no way intended to be considered limiting. By way of example, references to convolution operations hereinabove also encompass mathematical operations including, but not limited to, transformation into the frequency domain, multiplication, and inverse transformation from the frequency domain, designed to achieve results similar to spatial domain convolution methods. Therefore, reference to the details of the preferred embodiments are not intended to limit their scope, which is limited only by the scope of the claims set forth below.

The instant specification continues on the following page.

Recently, we have developed ab initio, or first-principle models and fast algorithms for simulations of photolithographic processes (H. Wei, "Photolithographic Process Simulation," US Patent Pending). Essential to our fast algorithm is a technique, originally called space-variation separated (SVS) series expansion, of representing a physical quantity being dependent on both spatial (often planar) coordinate(s) and values of process variations and/or a depth into a photosensitive medium. Such SVS series is a sum of multiple terms, with each term being a product of one function of spatial coordinate(s) that does not depend on the values of process variations and/or depth into the photosensitive medium and another function that depends on the values of process variations and/or depth into the photosensitive medium. In an SVS series expansion, the functions of spatial coordinate(s) may be called basis spatial functions, and the functions that depend on the values of process variations and/or depth into the photosensitive medium may be called expansion coefficients. In particular, when used to represent the amplitude or intensity distribution of an image of a mask through a photolithographic system, such SVS technique is manifested in efficient computer algorithms for photolithographic simulations, which have fixed mask-kernel convolutions separated from variable coefficients representing process variations. In this regard, the technique of series expansion and computer algorithms may be called convolution-variation separated (CVS). The two terms CVS and SVS will be hereinafter used interchangeably to denote the same technique and algorithms.

In one preferred embodiment, the point-spread function (PSF) of a projection system in an optical exposure system for photolithography is represented by an SVS series expansion, $$PSF(r; \text{var}) = \sum_{k=0}^{K} C_k(\text{var}) PSF_k(r), \qquad (1)$$

where var denotes a collection of parameters of process variations including, for example, defocus, depth into resist film, and lens aberrations, etc., the basis spatial functions $PSF_k(r)$, $\forall k \in [0, K]$, are dependent on the planar spatial coordinate r and independent of var, namely, the parameters of process variations, whereas the expansion coefficients $C_k(\text{var})$, $\forall k \in [0, K]$, depend on the parameters of process variations. With the illumination system of an optical exposure system characterized by a mutual intensity function $MI(r_1, r_2)$, which is further Mercer-expanded into coherent modes (CMs) with positive expansion coefficients $\mu_1 \geq \mu_2 \geq \ldots > 0$, $$MI(r_1, r_2) = \sum_{n=1}^{N} \mu_n CM_n(r_1) CM_n^*(r_2), \qquad (2)$$

the optical exposure system is represented by a set of model kernels (KERs), $$KER_n(r; \text{var}) = CM_n(r) PSF(r; \text{var}) \qquad (3)$$
$$= \sum_{k=0}^{K} C_k(\text{var}) KER_{nk}(r), \forall n \in [1, N],$$

with $$KER_{nk}(r) = CM_n(r) PSF_k(r), \qquad (4)$$
$$\forall n \in [1, N],$$
$$\forall k \in [0, K],$$

and the intensity distribution $I_{TAR}(q; \text{var})$ of an image resulted from optical projection of a mask with a mask transmittance function MASK(r) onto a target plane or volume is calculated as, $$I_{TAR}(q; \text{var}) = \sum_{n=1}^{N} \mu_n \left| \sum_{k=0}^{K} C_k^*(\text{var}) \langle KER_{nk}(r) \| MASK(r+q) \rangle \right|^2. \quad (5)$$

For each $n \in [1, N]$, let $$F_n(q; \text{var}) = \sum_{k=0}^{K} C_k^*(\text{var}) \langle KER_{nk}(r) \| MASK(r+q) \rangle, \quad (6)$$

denote the image amplitude distribution due to the nth coherent mode of the illumination field. The above equation is obviously a CVS series expansion for the amplitude distribution $F_n(q; \text{var})$, $\forall n \in [1, N]$, with $\{\langle KER_{nk}(r) \| MASK(r+q) \rangle\}_{k=0}^{K}$ as basis spatial functions and $\{C_k^*(\text{var})\}_{k=0}^{K}$ as expansion coefficients.

In a practical computer program simulating the image of a mask on a target, the model kernels $KER_{nk}(r)$, $n \in [1, N]$, $k \in [0, K]$ may be pre-computed, and each may be convolved with the mask transmittance function MASK(r) once to yield a convolution result (CR) of the form, $$CR_{nk}(r) = \langle KER_{nk}(r) \| MASK(r+q) \rangle, n \in [1, N], k \in [0, K], \quad (7)$$

which is stored in a computer memory medium. Then for an arbitrary condition of process variations represented by var, the amplitude distributions $F_n(q; \text{var})$, $n \in [1, N]$ may be readily calculated by summing up the CVS series of equation (6). Finally, totaling the amplitude distributions squared gives intensity distributions of the mask image under process variations var. For each subsequent var of process variations after the first, the task of calculating a target image reduces to: 1) calculating the coefficients $\{C_k(\text{var})\}_{k=0}^{K}$ by decomposing a new PSF(r; var) into a CVS series as in equation (1); 2) summing up the stored CRs weighted by the coefficients $\{C_k^*(\text{var})\}_{k=0}^{K}$ to obtain the amplitude distributions $\{F_n(q; \text{var})\}_{n=1}^{N}$, as in equation (6); 3) summing up the amplitude distributions squared to get a target image. The computational cost per each target point (CPP) is proportional to the number of model kernels, which is N(K+1).

Direct CVS Series Expansions for Image Intensities

Another method is to expand equation (5) into a direct CVS series for the image intensity $I_{TAR}(r)$, $$I_{TAR}(q; \text{var}) = \sum_{n=1}^{N} \mu_n \left| \sum_{k=0}^{K} C_k^*(\text{var}) CR_{nk}(r) \right|^2 \quad (8)$$

$$= \sum_{k=0}^{K} \sum_{k'=0}^{K} C_k(\text{var}) C_{k'}^*(\text{var}) PI_{kk'}(r),$$

where $\{PI_{kk'}\}_{k,k' \geq 0}$ denote partial intensities (PIs) represented as, $$PI_{kk'}(r) = \sum_{n=1}^{N} \mu_n CR_{nk}^*(r) CR_{nk'}(r), \quad (9)$$

$\forall k, k' \in [0, K]$.

Note that each partial intensity is not necessarily real-valued. Equation (8) may be considered as a CVS series expansion for the image intensity distribution $I_{TAR}(q; \text{var})$ with basis spatial functions $\{PI_{kk'}\}_{k,k' \geq 0}$ independent of var as process variations and expansion coefficients $\{C_k(\text{var}) C_{k'}^*(\text{var})\}_{k,k' \geq 0}$ dependent upon var as process variations. Viewed from another angle, the series expansion may also be regarded as a quadratic form of the variable coefficients $\{C_k(\text{var})\}_{k=0}^{K}$. The PIs may be computed once from the CRs and stored in a computer memory medium. Then for each subsequent var as process variations after the first, the task of calculating a target image reduces to: 1) computing the coefficients $\{C_k(\text{var})\}_{k=0}^{K}$ by decomposing a new PSF(r; var) into a CVS series as in equation (1); 2) calculating the products of pairs of coefficients of the form $C_k(\text{var}) C_{k'}^*(\text{var})$, $k, k' \geq 0$; 3) summing up the PIs weighted by $\{C_k(\text{var}) C_{k'}^*(\text{var})\}_{k,k' \geq 0}$ to get a target image. The CPP is proportional to the number of products of pairs of coefficients of the form $C_k(\text{var}) C_{k'}^*(\text{var})$, $k, k' \geq 0$, which is $(K+1)(K+2)/2$, with each pair of complex conjugate terms being counted as one. The CPP may be significantly reduced when $K < 2(N-1)$, as a result of combining effects of different coherent modes together in equations (8) and (9).

This method of direct CVS series expansions for image intensities has the Abbe formulation of imaging included as a special case, where the illumination source is divided into, and modeled as, a collection of non-overlapping and mutually incoherent light pixels. The illumination field of each light pixel may be considered as one coherent mode, so that the Abbe formulation of imaging is still represented by the mathematical framework of equations (3), (4), and (5), and the above method of computing image intensities under process variations applies as well. More specifically, representing the illumination source by non-overlapping light pixels amounts to a natural and computational cost free Mercer-like expansion for the mutual intensity function in the same form of equation (2), where $n \in [1, N]$ would index individual light pixels, then $\{\mu_n\}_{n=1}^{N}$ are simply pixel intensities, and the coherent modes are just, for example, plane waves $CM_n(r) = \exp(i 2\pi k_n \cdot r)$ (or other wave forms depending on the actual optics of the illumination system) generated by the light pixels to illuminate the mask, with $k_n = (k_x^{(n)}, k_y^{(n)})$ being the spatial frequency determined by the position of the nth light pixel, $\forall n \in [1, N]$. Consequently, the model kernels of equation (4) would be simply the basis spatial functions multiplied by light-pixel-dependent plane waves, namely, frequency-shifted versions of the same basis spatial functions as in equation (1). Equivalently, the model kernels of different light pixels may all be chosen the same and identical to the corresponding basis spatial functions, but then the mask transmittance function MASK(r) needs to be frequency-shifted depending on the position of individual light pixels, in order for equation (7) to generate the same convolution results. Since the number of light pixels N in Abbe imaging is often quite large, whereas the number of necessary basis spatial functions (K+1) to expand the PSF is often much smaller, the reduction of CPP from N(K+1) to (K+1)(K+2)/2 could be rather significant, when using the above method of direct CVS series expansions for image intensities. Furthermore, the computational cost free Mercer-like expansion for an illumination source characterized by incoherent light pixels, in stead of a computation-intensive matrix singular value decomposition to optimally Mercer-expand either a mutual intensity function or a transmission cross coefficient (TCC), could often represent a significant advantage, especially when dealing with an optical exposure system having a variable illumination source.

Alternatively in the Hopkins formulation, the optical exposure system may be characterized by a TCC represented as, $$TCC(r_1,r_2;var)=PSF(r_1;var)MI(r_1,r_2)PSF^*(r_2;var), \quad (10)$$

which is used to calculate the intensity distribution of a target image as, $$I_{TAR}(q;var)=\langle MASK(r_1+q)|TCC(r_1,r_2;var)|MASK(r_2+q)\rangle. \quad (11)$$

Substituting equation (1) into equations (10) and (11), we get another direct CVS series expansion for the image intensity, $$I_{TAR}(q;\text{var}) = \sum_{k=0}^{K}\sum_{k'=0}^{K} C_k(\text{var})C_{k'}^*(\text{var})PI_{kk'}(q), \quad (12)$$

where the partial intensities $\{PI_{kk'}\}_{k,k'\geq 0}$ are represented as, $$PI_{kk'}(q)=\langle MASK(r_1+q)|PTCC_{kk'}(r_1,r_2)|MASK(r_2+q)\rangle, \quad (13)$$

with the partial TCCs (PTCCs) represented as, $$PTCC_{kk'}(r_1,r_2)=PSF_k(r_1)MI(r_1,r_2)PSF_{k'}^*(r_2), \forall k,k' \in [0,K]. \quad (14)$$

Again, the PIs in equation (13) may be pre-computed once and stored in a computer memory medium. Then for each subsequent var as process variations after the first, the task of calculating a target image reduces to: 1) computing the coefficients $\{C_k(\text{var})\}_{k=0}^K$ by decomposing a new PSF(r; var) into a CVS series as in equation (1); 2) calculating the products of pairs of coefficients of the form $C_k(\text{var})C_{k'}^*(\text{var})$, k, k'$\geq$0; 3) summing up the PIs weighted by $\{C_k(\text{var})C_{k'}^*(\text{var})\}_{k,k'\geq 0}$ to get a target image.

Regarded as Hilbert-Schmidt kernels, not all PTCCs in equation (14) correspond to a Hermitian integral operator. For a PTCC that does correspond to a Hermitian operator, one of the conventional Hopkins methods and ours as disclosed in H. Wei, "Photolithographic Process Simulation," US Patent Pending, may be employed to treat the partial TCC and to compute the corresponding PI efficiently, which may proceed as Mercer-expanding the partial TCC to get model kernels, then convolving the model kernels with the mask transmittance function, and finally summing up the CRs squared. A PTCC that does not correspond to a Hermitian operator may be, for example, represented as a linear combination of two Hilbert-Schmidt kernels as in the following, $$PTCC(r_1,r_2) = \frac{1}{2}\left[\begin{array}{c}PTCC(r_1,r_2)+\\PTCC^*(r_2,r_1)\end{array}\right]+\frac{i}{2}\left[\begin{array}{c}iPTCC^*(r_2,r_1)-\\iPTCC(r_1,r_2)\end{array}\right], \quad (15)$$

where both kernels $[PTCC(r_1, r_2)+PTCC^*(r_2, r_1)]$ and $[iPTCC^*(r_2, r_1)-iPTCC(r_1, r_2)]$ correspond to a Hermitian operator, therefore both are amenable to a known or disclosed method for Mercer-expansion and efficient calculation of image intensities. Moreover, it is noted that for each pair of (k, k')⊂[0, K], the two terms $C_k(\text{var})C_{k'}^*(\text{var})PI_{kk'}(q)$ and $C_{k'}(\overline{\text{var}})C_k^*(\text{var})PI_{k'k}(q)$ in equation (12) are complex conjugate with respect to each other, and may be combined together in the summation as, $$C_k(var)C_{k'}^*(var)PI_{kk'}(q)+C_{k'}(var)C_k^*(var)PI_{k'k}(q)=2Re[C_k(var)C_{k'}^*(var)PI_{kk'}(q)]. \quad (16)$$

Therefore, only (K+1)(K+2)/2 PIs need to be pre-computed and stored, then linearly combined for each different var of process variations and/or depth into the photoresist.

Efficient Representations of Mask Transmittance Functions Dependent Upon Incident Angle of Illumination Beams The optical transmittance function, or characteristics, of a thick mask is usually dependent on the incident angle of an illumination beam, or plane wave. For a partially coherent imaging system, if using Abbe's formulation and dividing a spatially extensive illumination source into light pixels, then a different mask transmittance function may be needed for each illumination plane wave generated by every light pixel. Such representation of mask transmittance function becomes rather inefficient when the number of light pixels is large, and may become unusable when the positions of the light pixels change or when another set of light pixels are illuminating the mask. A better way of representation may group nearby pixels into clusters, or divide a spatially extensive illumination source into non-overlapping radiating regions each consisting of multiple pixels, and associate to each pixel cluster or radiating region an approximate mask transmittance function independent of the location of pixels within the same cluster for the zeroth-order approximation. To go beyond the zeroth-order approximation, we may represent the incident-angle-dependent mask transmittance function by a series expansion consisting of basis spatial functions independent of the incident angle and expansion coefficients dependent upon the incident angle. In one preferred embodiment, a mask transmittance function u(k; x, y), where k=($k_x$, $k_y$, $k_z$) is the wave vector of an incident plane wave $\exp[i2\pi(k_x x+k_y y+k_z z-vt)]$, and (x, y) is a planar coordinate on the mask plane, may be expanded into a Taylor series about the spatial frequencies $k_x$ and $k_y$ of the incident beam, $$u(k;x,y) = \sum_{m\geq 0}\sum_{n\geq 0}(k_x-k_{0x})^m(k_y-k_{0y})^n u_{mn}(k_0;x,y)e^{i2\pi(k_x x+k_y y)}, \quad (17)$$

where $k_0$=($k_{0x}$, $k_{0y}$, $k_{0z}$) is a constant average wave vector for the pixel cluster, so the basis spatial functions $u_{mn}(k_0; x, y)$, $\forall m, n\geq 0$, are independent of any deviation of a wave vector from $k_0$, as long as the wave vector is associated with a source point within the pixel cluster. For example, we may use, $$u(k;x,y)=[u_0(k_0;x,y)+u_1(k_0;x,y)(k_x-k_{0x})+u_2(k_0;x,y)(k_y-k_{0y})]e^{i2\pi(k_x x+k_y y)}, \quad (18)$$

for a first-order approximation.

We note that it is rather important to factor out the phase factor $e^{i2\pi(k_x x+k_y y)}$, because the size of a mask may be so large that even a tiny deviation in k may induce a large phase shift of the incident wave between two points far separated on the mask. Alternatively, when a pixel cluster is sufficiently small that ambit$\times[(k_x-k_{0x})^2+(k_y-k_{0y})^2]^{1/2}$ is always much less than ½, where ambit is a critical distance between two points on mask beyond which the optical proximity effect due to wave diffraction becomes negligible, then the phase factor $e^{i2\pi(k_x x+k_y y)}$ in equation (17) may also be Taylor-expanded around $e^{i2\pi(k_{0x}x+k_{0y}y)}$ in terms of powers of $k_x-k_{0x}$ and $k_y-k_{0y}$, and the series may be rearranged into, $$u(k;x,y) = \sum_{m\geq 0}\sum_{n\geq 0}(k_x-k_{0x})^m(k_y-k_{0y})^n u'_{mn}(k_0;x,y)e^{i2\pi(k_{0x}x+k_{0y}y)}. \quad (19)$$

For example, we have, $$u(k;x,y)=[u'_0(k_0;x,y)+u'_1(k_0;x,y)(k_x-k_{0x})+u'_2(k_0;x,y)(k_y-k_{0y})]e^{i2\pi(k_{0x}x+k_{0y}y)}, \quad (20)$$

up to the first-order terms of $k_x-k_{0x}$ and $k_y-k_{0y}$, with the basis spatial functions represented as, $$u'_0(k_0;x,y) = u_0(k_0;x,y), \qquad (21)$$

$$u'_1(k_0;x,y) = u_1(k_0;x,y) + i2\pi x u_0(k_0;x,y), \qquad (22)$$

$$u'_2(k_0;x,y) = u_2(k_0;x,y) + i2\pi y u_0(k_0;x,y). \qquad (23)$$

Incorporation of Incident-Angle-Dependent Mask Transmittance Functions in Imaging Theories and Simulations The above representations of mask transmittance function may be applied straightforwardly to the Abbe theory of image formation, where the intensity distribution $I_t(x_t, y_t)$ on a target plane $(x_t, y_t)$ may be calculated as, $$I_t(x_t, y_t) = \int \left| \int \int u(k; x_m, y_m) K_{mt}(x_t - x_m, y_t - y_m) dx_m dy_m \right|^2 I_s(k_x, k_y) dk_x dk_y \qquad (24)$$

$$= \int |[u \star K_{mt}](k; x_t, y_t)|^2 I_s(k_x, k_y) dk_x dk_y,$$

where $K_{mt}(x, y)$ is the PSF of the projection system from the mask plane to the target plane, $I_s(k_x, k_y)$ is the strength of a pixel of the light source that generates a plane wave on the mask plane with spatial frequency $(k_x, k_y)$. Using the first-order approximation of equation (18), only three functions $u_0$, $u_1$, and $u_2$ are needed to represent an incident-angle-dependent mask transmittance function for each cluster of many pixels. Given each pixel within the cluster, which generates an illumination beam with wave vector $(k_x, k_y, k_z)$, equation (18) may be used to synthesize a mask transmittance function for this pixel, then the convolution $[u^*K_{mt}](k; x_t, y_t)$ needs to be evaluated, then squared and weighted by $I_s(k_x, k_y)$ to obtain a contributive intensity distribution.

Alternatively, using equation (19) or (20) with the phase factor corresponding to a fixed wave vector $k_0$, it is possible to significantly reduce the computational complexity, namely, the number of convolution operations needed for each pixel cluster. For instance, up to the first-order approximation for the mask transmittance function, the convolution inside the absolute value operator $|\cdot|$ of equation (24) reduces to, $$[u^*K_{mt}](k;x_t,y_t) = A_0(x_t,y_t) + (k_x-k_{0x})A_1(x_t,y_t) + (k_y-k_{0y})A_2(x_t,y_t), \qquad (25)$$

where the basis spatial functions are calculated as, $$A_l(x_t,y_t) = \int u'_l(k_0;x_m,y_m) e^{i2\pi(k_{0x}x_m+k_{0y}y_m)} K_{mt}(x_t-x_m,y_t-y_m) dx_m dy_m, \qquad (26)$$

for each $l \in [0, 2]$. It becomes apparent that only three convolutions as in equation (26) need to be evaluated and recorded once for each pixel cluster. Then for each of a plurality of light pixels inside this cluster, the convolution $[u^*K_{mt}](k; x_t, y_t)$ may be quickly computed using equation (25) with the recorded data. The resulted amplitude distribution is squared and weighted by the strength of the corresponding light pixel to become a contribution to the image intensity. Such method would greatly reduce the computational complexity comparing to conventional methods that perform one (or several) full convolution(s) per each light pixel, while enabling physical and accurate simulation of varying optical transmission characteristics of a mask under different incident angles of illumination beams.

Our efficient representations of an incident-angle-dependent mask transmittance function are also applicable to the Hopkins theory of image formation, in which the intensity distribution $I_t(x_t, y_t)$ on the target plane $(x_t, y_t)$ is represented as, $$I_t(x_t,y_t) = \int\int\int\int\int\int u^*(k;x_{m1},y_{m1}) K_{mt}^*(x_t-x_{m1},y_t-y_{m1}) I_s(k_x,k_y)$$

$$\times K_{mt}(x_t-x_{m2},y_t-y_{m2}) u(k;x_{m2},y_{m2})$$
$$dx_{m1} dy_{m1} dx_{m2} dy_{m2} dk_x dk_y. \qquad (27)$$

Equations (17) and (27) may be combined to derive a generalized Hopkins equation for calculating images under an incident-angle-dependent mask transmittance function. For example, up to the first-order approximation, equation (18) may be substituted into equation (27) to yield, $$I_t(x_t, y_t) = \int\int\int\int u_0^*(k_0; x_{m1}, y_{m1}) u_0(k_0; x_{m2}, y_{m2}) \times \qquad (28)$$

$$TCC_0(x_t - x_{m1}, y - y_{m1}; x_t - x_{m2}, y_t - y_{m2})$$

$$dx_{m1} dy_{m1} dx_{m2} dy_{m2} +$$

$$\int\int\int\int [u_0^*(k_0; x_{m1}, y_{m1}) u_1(k_0; x_{m2}, y_{m2}) +$$

$$u_1^*(k_0; x_{m1}, y_{m1}) u_0(k_0; x_{m2}, y_{m2})] \times TCC_1(x_t - x_{m1},$$

$$y_t - y_{m1}; x_t - x_{m2}, y_t - y_{m2}) dx_{m1} dy_{m1} dx_{m2} dy_{m2} +$$

$$\int\int\int\int [u_0^*(k_0; x_{m1}, y_{m1}) u_2(k_0; x_{m2}, y_{m2}) +$$

$$u_2^*(k_0; x_{m1}, y_{m1}) u_0(k_0; x_{m2}, y_{m2})] \times TCC_2(x_t - x_{m1},$$

$$y_t - y_{m1}; x_t - x_{m2}, y_t - y_{m2}) dx_{m1} dy_{m1} dx_{m2} dy_{m2} +$$

$$\int\int\int\int u_1^*(k_0; x_{m1}, y_{m1}) u_1(k_0; x_{m2}, y_{m2}) \times TCC_3(x_t - x_{m1},$$

$$y_t - y_{m1}; x_t - x_{m2}, y_t - y_{m2}) dx_{m1} dy_{m1} dx_{m2} dy_{m2} +$$

$$\int\int\int\int [u_1^*(k_0; x_{m1}, y_{m1}) u_2(k_0; x_{m2}, y_{m2}) +$$

$$u_2^*(k_0; x_{m1}, y_{m1}) u_1(k_0; x_{m2}, y_{m2})] \times TCC_4(x_t - x_{m1},$$

$$y_t - y_{m1}; x_t - x_{m2}, y_t - y_{m2}) dx_{m1} dy_{m1} dx_{m2} dy_{m2} +$$

$$\int\int\int\int u_2^*(k_0; x_{m1}, y_{m1}) u_2(k_0; x_{m2}, y_{m2}) \times TCC_5(x_t - x_{m1},$$

$$y_t - y_{m1}; x_t - x_{m2}, y_t - y_{m2}) dx_{m1} dy_{m1} dx_{m2} dy_{m2},$$

where the transmission cross coefficients (TCCs) are represented as, $$TCC_0(x_1,y_1;x_2,y_2) = \iint K_{mt}^*(x_1,y_1) e^{i2\pi(k_x x_1+k_y y_1)} I_s(k_x,k_y)$$

$$\times e^{-i2\pi(k_x x_2+k_y y_2)} K_{mt}(x_2,y_2) dk_x dk_y, \qquad (29)$$

$$TCC_1(x_1,y_1;x_2,y_2) = \iint K_{mt}^*(x_1,y_1) e^{i2\pi(k_x x_1+k_y y_1)} I_s(k_x,k_y)$$
$$(k_x-k_{0x})$$

$$\times e^{-i2\pi(k_x x_2+k_y y_2)} K_{mt}(x_2,y_2) dk_x dk_y, \qquad (30)$$

$$TCC_2(x_1,y_1;x_2,y_2) = \iint K_{mt}^*(x_1,y_1) e^{i2\pi(k_x x_1+k_y y_1)} I_s(k_x,k_y)$$
$$(k_y-k_{0y})$$

$$\times e^{-i2\pi(k_x x_2+k_y y_2)} K_{mt}(x_2,y_2) dk_x dk_y, \qquad (31)$$

$$TCC_3(x_1,y_1;x_2,y_2) = \iint K_{mt}^*(x_1,y_1) e^{i2\pi(k_x x_1 + k_y y_1)} I_s(k_x,k_y)$$
$$(k_x - k_{0x})^2$$
$$\times e^{-i2\pi(k_x x_2 + k_y y_2)} K_{mt}(x_2,y_2) dk_x dk_y, \quad (32)$$

$$TCC_4(x_1,y_1;x_2,y_2) = \iint K_{mt}^*(x_1,y_1) e^{i2\pi(k_x x_1 + k_y y_1)} I_s(k_x,k_y)$$
$$(k_x - k_{0x})(k_y - k_{0y})$$
$$\times e^{-i2\pi(k_x x_2 + k_y y_2)} K_{mt}(x_2,y_2) dk_x dk_y. \quad (33)$$

$$TCC_5(x_1,y_1;x_2,y_2) = \iint K_{mt}^*(x_1,y_1) e^{i2\pi(k_x x_1 + k_y y_1)} I_s(k_x,k_y)$$
$$(k_y - k_{0y})^2$$
$$\times e^{-i2\pi(k_x x_2 + k_y y_2)} K_{mt}(x_2,y_2) dk_x dk_y. \quad (34)$$

Since each of the above TCCs is a Hermitian Hilbert-Schmidt kernel, that is, $$TCC_k(x_2,y_2;x_1,y_1) = [TCC_k(x_1,y_1;x_2,y_2)]^*, \forall k \geq 0, \quad (35)$$

they may be Mercer-expanded as, $$TCC_k(x_1, y_1; x_2, y_2) = \sum_{n \geq 0} \xi_{kn} \Phi_{kn}^*(x_1, y_1) \Phi_{kn}(x_2, y_2), \quad (36)$$
$$\forall k \geq 0,$$

where for each $k \geq 0$, $\{\Phi_{kn}\}_{n \geq 0}$ are the eigenfunctions of the linear (integral) operator associated with the Hilbert-Schmidt kernel, and the corresponding eigenvalues $\{\xi_{kn}\}_{n \geq 0}$ are real-valued. In particular, $TCC_0$, $TCC_3$, and $TCC_5$ are positive-definite, whose eigenvalues are positive numbers.

The eigenfunctions $\{\Phi_{kn}\}_{n \geq 0}$ are usually called model kernels, in terms of which, calculating the intensity distribution of equation (28) amounts to convolution operations, $$I_t(x_t, y_t) = \sum_{n \geq 0} \xi_{0n} |u_0 \star \Phi_{0n}|^2 + 2 \sum_{n \geq 0} \xi_{1n} \text{Re}[(u_0 \star \Phi_{1n}) \star (u_1 \star \Phi_{1n})] + \quad (37)$$
$$2 \sum_{n \geq 0} \xi_{2n} \text{Re}[(u_0 \star \Phi_{2n}) \star (u_2 \star \Phi_{2n})] + \sum_{n \geq 0} \xi_{3n} |u_1 \star \Phi_{3n}|^2 +$$
$$2 \sum_{n \geq 0} \xi_{4n} \text{Re}[(u_1 \star \Phi_{4n}) \star (u_2 \star \Phi_{4n})] + \sum_{n \geq 0} \xi_{5n} |u_2 \star \Phi_{5n}|^2,$$

where $\forall k \in [0, 5]$, $\forall n \geq 0$, and for each function $v(x, y) \in \{u_0(k_0; x, y), u_1(k_0; x, y), u_2(k_0; x, y)\}$, $v^* \Phi_{kn}$ denotes the convolution between $v$ and $\Phi_{kn}$ as, $$[v^* \Phi_{kn}](x_t,y_t) = \iint v(x_m,y_m) \Phi_{kn}(x_t - x_m, y_t - y_m) dx_m dy_m. \quad (38)$$

Vectorial Models of Imaging and CVS Methods

A polarized mask-diffracted field may be represented in the spatial frequency domain by a vector-valued function $[A_*(f_x, f_y), A_\phi(f_x, f_y)]^T$, where $A_*(f_x, f_y)$ and $A_\phi(f_x, f_y)$ are amplitudes of the TM and TE modes of a plane wave with frequency $(f_x, f_y)$. For a vectorial model of imaging from a mask plane onto an image plane at a certain depth in the resist film, the projection transfer function (also known as the pupil function in the spatial frequency domain) may be represented by a 3×2 matrix function, $$K(f_x, f_y) = \begin{bmatrix} K_{\rho*}(f_x, f_y) & K_{\rho\phi}(f_x, f_y) \\ K_{\phi*}(f_x, f_y) & K_{\phi\phi}(f_x, f_y) \\ K_{z*}(f_x, f_y) & K_{z\phi}(f_x, f_y) \end{bmatrix}, \quad (39)$$

which brings $[A_*(f_x, f_y), A_\phi(f_x, f_y)]^T$ into a 3-component polarized amplitude distribution, $$\begin{bmatrix} B_\rho(f_x, f_y) \\ B_\phi(f_x, f_y) \\ B_z(f_x, f_y) \end{bmatrix} = \begin{bmatrix} K_{\rho*}(f_x, f_y) & K_{\rho\phi}(f_x, f_y) \\ K_{\phi*}(f_x, f_y) & K_{\phi\phi}(f_x, f_y) \\ K_{z*}(f_x, f_y) & K_{z\phi}(f_x, f_y) \end{bmatrix} \begin{bmatrix} A_*(f_x, f_y) \\ A_\phi(f_x, f_y) \end{bmatrix}. \quad (40)$$

When the projection lens is polarization independent, and the film-stack on wafer is uniform and normal to the z-axis, the vectorial projection transfer function reduces to, $$K(f_x, f_y) = \begin{bmatrix} K_{\rho*}(f_x, f_y) & 0 \\ 0 & K_{\phi\phi}(f_x, f_y) \\ K_{z*}(f_x, f_y) & 0 \end{bmatrix}. \quad (41)$$

This is the advantage of using cylindrical polarization decomposition. It is noted that in the ($\rho$, $\phi$, z) cylindrical coordinate, the TE component $[0, A_\phi(f_x, f_y)]^T$ is indeed along the $\phi$-direction, while the TM polarization $[A_*(f_x, f_y), 0]^T$ has both p and z components. Indeed, the mask-diffracted filed may be firstly represented in the (x, y, z) coordinate as $[A_x(x, y), A_y(x, y), A_z(x, y)]^T$, which may be Fourier-transformed into $[A_x(f_x, f_y), A_y(f_x, f_y), A_z(f_x, f_y)]^T$, and finally written in the TE/TM representation as, $[A_*(f_x, f_y), A_\phi(f_x, f_y)]^T$. The apparent reduction of degrees of freedom from 3 to 2 is justified when the mask-diffracted field is obtained at far field, where the field consists of plane waves each of which has only two polarizations.

In a fully ab initio model, each illumination light pixel generates a plane wave with two possible polarizations $P_1$ and $P_2$ to illuminate the mask. The two source polarizations generate mask-diffracted fields $[A_*^{(1)}(f_x, f_y), A_\phi^{(1)}(f_x, f_y)]^T$ and $[A_*^{(2)}(f_x, f_y), A_\phi^{(2)}(f_x, f_y)]^T$ respectively. For unpolarized light pixels, two orthogonal polarizations may be taken arbitrarily with equal intensity, such as TE and TM, or clockwise and anticlockwise circular polarizations. For strongly polarized light pixels, only one polarization vector along a predetermined direction may be needed, with zero or negligible intensity assigned to the orthogonal polarization vector. For a general partially polarized light pixel, its polarization state is described by a 2×2 positive-definite correlation matrix of polarization amplitudes. The matrix can always be diagonalized with two eigen polarization vectors $P_1$ and $P_2$, whose intensity weights are the diagonal entries of the diagonalized matrix. In any case, each light pixel may always be represented by at most two incoherent polarization vectors, each of which generates a diffracted field $[A_*^{(1)}(f_x, f_y), A_\phi^{(1)}(f_x, f_y)]^T$ or $[A_*^{(2)}(f_x, f_y), A_\phi^{(2)}(f_x, f_y)]^T$, which in turn produces a target image $[B_\rho^{(1)}(x, y), B_\phi^{(1)}(x, y), B_z^{(1)}(x, y)]^T$ or $[B_\rho^{(2)}(x, y), B_\phi^{(2)}(x, y), B_z^{(2)}(x, y)]^T$. A nice feature of this formulation is that the two target images corresponding to $P_1$ and $P_2$ of the same light pixel are incoherent, so that they are simply intensity-additive. For an incomplete ab initio model without first-principle mask scattering, people often assume two incoherent polarization states $[0, A_\phi(f_x, f_y)]^T$ and $[A_*(f_x, f_y), 0]^T$, where $A_\phi(f_x, f_y)$ and $A_*(f_x, f_y)$ are often the same and calculated from the same thin-mask model. The resulted target images are of course presumed incoherent and intensity-additive.

What is claimed is:
1. A computer-implemented method for simulating a pattern transfer from a mask having a mask transmittance function to a target in a photolithographic processing system, comprising the computer-implemented steps of:

receiving a first value of a process variation associated with at least one of the mask, the target, and the photolithographic processing system;

computing, by use of a computer, a first complete simulation result, comprising:

computing a plurality of partial simulation results by convolution of the mask transmittance function with a respective plurality of convolution kernels at least partially characteristic of the photolithographic processing system; and computing said first complete simulation result by combining said partial simulation results according to said first process variation value;

receiving a plurality of subsequent values of said process variation; and reusing said plurality of partial simulation results computed in said computing the first complete simulation result to compute a plurality of subsequent complete simulation results corresponding respectively to said plurality of subsequent process variation values, said reusing comprising computing each said subsequent complete simulation result by combining said partial simulation results in a manner that at least partially depends on the subsequent process variation value corresponding to that subsequent complete simulation result.

2. The computer-implemented method of claim 1, wherein said target comprises a photoresist layer, and wherein said complete simulation result is representative of an optical intensity in said photoresist layer.

3. The computer-implemented method of claim 1, wherein said target comprises a semiconductor wafer layer, and wherein said complete simulation result is representative of at least one of a final semiconductor two-dimensional pattern, a final semiconductor three-dimensional pattern, and a final semiconductor etch depth profile.

4. The computer-implemented method of claim 1, wherein none of said convolution kernels depends upon said at least one process variation.

5. The computer-implemented method of claim 1, wherein said first and subsequent complete simulation results correspond in outcome to computing first and subsequent weighted combinations, respectively, of said plurality of partial simulation results according to first and subsequent pluralities of weighting factors, respectively, computed according to said first and subsequent values, respectively, of the process variation.

6. The computer-implemented method of claim 5, wherein said first and subsequent weighted combinations comprise first and subsequent sums, respectively, of squared magnitudes of said partial simulation results as weighted by said first and subsequent pluralities of weighting factors, respectively.

* * * * *